US009620643B2

(12) United States Patent
Leobandung

(10) Patent No.: US 9,620,643 B2
(45) Date of Patent: Apr. 11, 2017

(54) REDUCING PARASITIC CAPACITANCE AND RESISTANCE IN FINFET

(71) Applicant: International Business Machines Corporation, Armonk, NY (US)

(72) Inventor: Effendi Leobandung, Stormville, NY (US)

(73) Assignee: International Business Machines Corporation, Armonk, NY (US)

(*) Notice: Subject to any disclaimer, the term of this patent is extended or adjusted under 35 U.S.C. 154(b) by 2 days.

(21) Appl. No.: 14/606,220

(22) Filed: Jan. 27, 2015

(65) Prior Publication Data

US 2016/0218206 A1 Jul. 28, 2016

(51) Int. Cl.
| | | |
|---|---|---|
| H01L 23/04 | (2006.01) |
| H01L 29/78 | (2006.01) |
| H01L 29/06 | (2006.01) |
| H01L 29/66 | (2006.01) |
| H01L 21/306 | (2006.01) |
| H01L 21/02 | (2006.01) |

(52) U.S. Cl.
CPC ...... *H01L 29/785* (2013.01); *H01L 21/02233* (2013.01); *H01L 21/30604* (2013.01); *H01L 29/0649* (2013.01); *H01L 29/6656* (2013.01); *H01L 29/6681* (2013.01)

(58) Field of Classification Search
None
See application file for complete search history.

(56) References Cited

U.S. PATENT DOCUMENTS

| | | | |
|---|---|---|---|
| 7,238,567 B2 | 7/2007 | Xiong | |
| 7,247,913 B2 | 7/2007 | Yagishita | |
| 7,456,471 B2 | 11/2008 | Anderson et al. | |
| 7,646,046 B2 | 1/2010 | Russ et al. | |
| 7,683,428 B2 | 3/2010 | Chidambarrao et al. | |
| 7,902,011 B2 | 3/2011 | Park et al. | |
| 9,054,189 B1 * | 6/2015 | Kim | H01L 29/7848 |
| 9,236,397 B2 * | 1/2016 | Holt | H01L 29/66795 |
| 9,246,005 B2 * | 1/2016 | Basker | H01L 29/7848 |
| 2013/0154016 A1 | 6/2013 | Glass et al. | |

(Continued)

OTHER PUBLICATIONS

Connelly et al., "A New Route to Zero-Barrier Metal Source/Drain MOSFETs," IEEE Transactions on Nanotechnology, vol. 3, No. 1, 2004, pp. 98-104.

(Continued)

*Primary Examiner* — Fernando L Toledo
*Assistant Examiner* — Valerie N Newton
(74) *Attorney, Agent, or Firm* — Edward J. Wixted, III

(57) ABSTRACT

Embodiments of the invention include a method for fabricating a semiconductor device and the resulting structure. The method can include providing a substrate. The method can include forming a fin on the substrate. The method can include forming a dummy gate on the fin and the substrate. The method can include etching portions of the fin not located below the dummy gate. The method can include epitaxially forming doped source and drain regions on the exposed sides of the fin. The method can include forming an insulative spacer on exposed sides of the dummy gate. The method can include forming one or more metal regions adjacent to the doped source and drain regions.

12 Claims, 9 Drawing Sheets

(56) References Cited

U.S. PATENT DOCUMENTS

2014/0167163 A1* 6/2014 Cheng ................ H01L 29/785
257/347

OTHER PUBLICATIONS

Coss et al.,"Contact Resistance Reduction to FinFET Source/Drain Using Novel Dielectric Dipole Schottky Barrier Height Modulation Method," IEEE Electron Device Letters, vol. 32, No. 7, 2011, pp. 862-864.

Xiong et al., "A Comparison Study of Symmetric Ultrathin-Body Double-Gate Devices with Metal Source/Drain and Doped Source/Drain," IEEE Transactions on Electron Devices, vol. 52, No. 8, 2005, pp. 1859-1867.

* cited by examiner

REDUCING PARASITIC CAPACITANCE AND RESISTANCE IN FINFET

BACKGROUND OF THE INVENTION

The present invention relates generally to the field of transistors, and more particularly to the reduction of parasitic capacitance and resistance in finFET devices.

With the increasing down scaling of integrated circuits and increasingly higher requirements for the number of transistors present in integrated circuits, transistors need to have higher drive currents with increasingly smaller dimensions. In its basic form, a finFET device includes a source, a drain and one or more fin-shaped channels between the source and the drain. A gate electrode over the fin(s) regulates electron flow between the source and the drain. In general, finFET devices facilitate manufacturing smaller and smaller transistors, but have higher parasitic capacitance and resistance than other transistor designs.

SUMMARY

Embodiments of the invention disclose a method for fabricating a semiconductor device with reduced parasitic resistance and parasitic capacitance and the resulting structure. The method can include providing a substrate. The method can include forming a fin on the substrate. The method can include forming a dummy gate on the fin and the substrate. The method can include etching portions of the fin not located below the dummy gate. The method can include epitaxially forming doped source and drain regions on the exposed sides of the fin. The method can include forming an insulative spacer on the exposed sides of the dummy gate. The method can include forming one or more metal regions adjacent to the doped source and drain regions.

DETAILED DESCRIPTION

Embodiments of the present invention generally provide a finFET device with reduced parasitic capacitance and parasitic resistance. A detailed description of embodiments of the claimed structures and methods are included herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale; some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the Figures. The terms "overlying", "atop", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

Figure 1A:
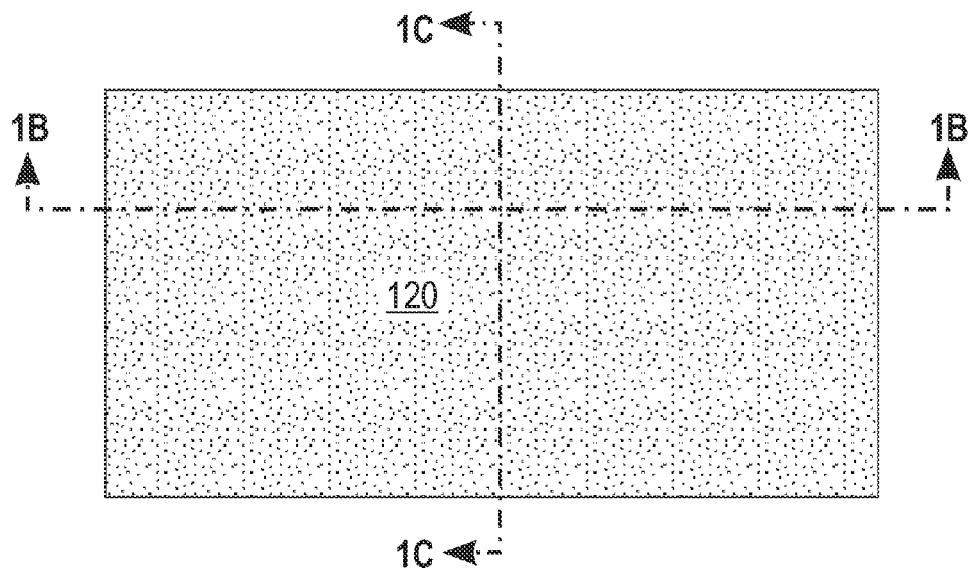
FIG. 1A depicts a top view of a semiconductor substrate and buried oxide layer on which a finFET device may be fabricated, in accordance with an embodiment of the invention.
Figure 1B:
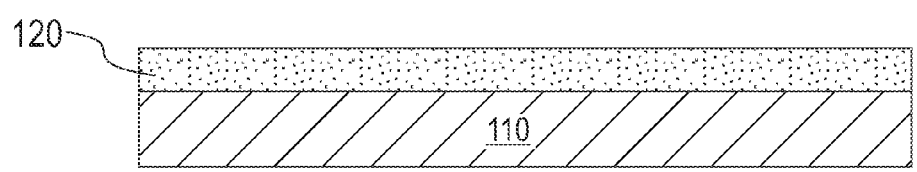
FIG. 1B depicts a section view of a semiconductor substrate and buried oxide layer on which a finFET device may be fabricated, in accordance with an embodiment of the invention.
Figure 1C:
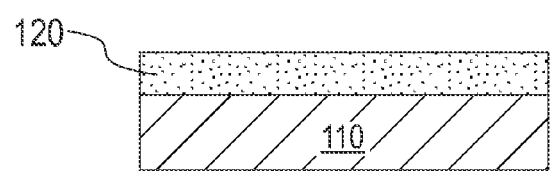
FIG. 1C depicts a section view of a semiconductor substrate and buried oxide layer on which a finFET device may be fabricated, in accordance with an embodiment of the invention.

The present invention will now be described in detail with reference to the Figures. FIGS. 1A, 1B and 1C illustrate a top view and two section views of a starting wafer including semiconductor substrate 110 and buried oxide layer 120, in accordance with an embodiment of the invention. Semiconductor substrate 110 is a substrate on which a finFET device may be formed. Semiconductor substrate 110 is a semiconductor material, preferably a silicon-containing material including, but not limited to, silicon, germanium, silicon germanium alloys, germanium alloys, indium alloys, silicon carbon alloys, or silicon germanium carbon alloys. Buried oxide layer 120 is present above semiconductor substrate 110 in various embodiments of the invention. In general, buried oxide layer 120 acts as an electrical insulator below the finFET transistor formed in various embodiments of the invention. In general, the thickness of semiconductor substrate 110 is between 100 μm and 1000 μm in various embodiments of the invention. While the depicted embodiment includes an illustration of silicon on insulator (SOI) construction, it should be appreciated by one skilled in the art that the invention is not limited to SOI construction, and that other types of semiconductor construction can be used in various embodiments of the invention, for example, bulk silicon construction. In embodiments where bulk silicon construction is used, buried oxide layer 120 may not be present in the starting wafer.

Figure 2A:
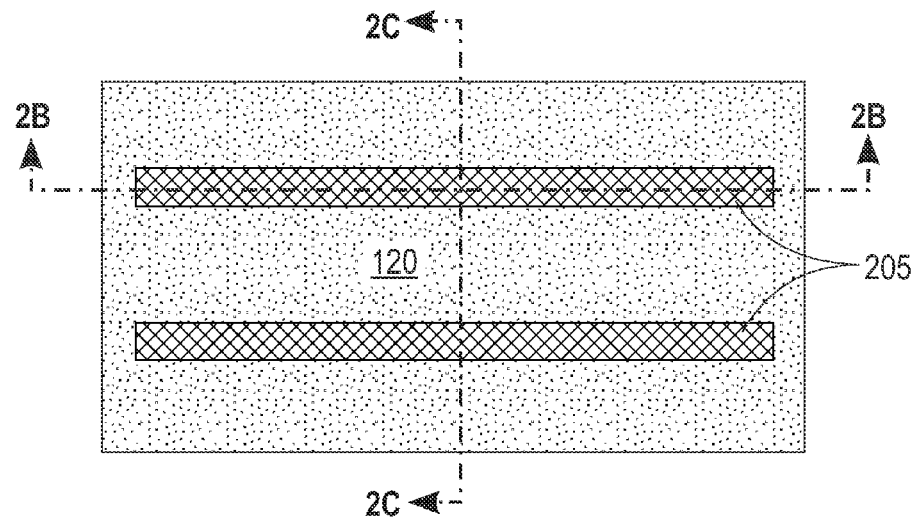
FIG. 2A depicts a top view of the deposition and etching of a layer of semiconductor material deposited on the semiconductor substrate of FIG. 1A, in accordance with an embodiment of the invention.
Figure 2B:
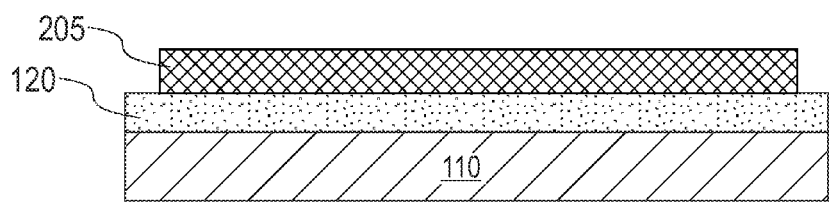
FIG. 2B depicts a section view of the deposition and etching of a layer of semiconductor material deposited on the semiconductor substrate of FIG. 1A, in accordance with an embodiment of the invention.
Figure 2C:
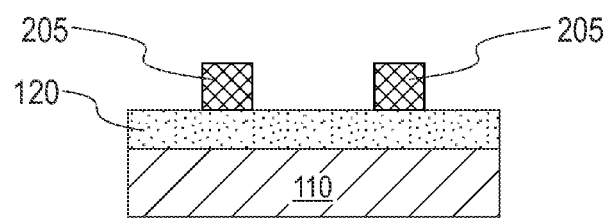
FIG. 2C depicts a section view of the deposition and etching of a layer of semiconductor material deposited on the semiconductor substrate of FIG. 1A, in accordance with an embodiment of the invention.

FIGS. 2A, 2B, and 2C illustrate a top and two section views of the deposition and patterning of layer 205, in accordance with an embodiment of the invention. Layer 205 is used to form the channel or "fin" in the finFET device formed in the present invention. Although the depicted embodiment includes two "fins" or channels being used to act as a single finFET device, any number of fins may be present within each finFET device in various embodiments of the invention. In general, more fins are required in applications where more current must flow through the finFET device. The depicted embodiment illustrates an embodiment where the finFET device must accommodate more current than could safely be handled by a single fin. In some embodiments, such as the depicted embodiment, the current finFET device being created is an n-type finFET including a p-type fin and n-type contacts for source and drain. In such embodiments, layer 205 is composed of silicon doped with p-type dopants such as boron. Layer 205 is deposited using, for example, a bonding technique such as SIMOX or another method for forming an SOI wafer. In some embodiments the current finFET device is a p-type FET including an n-type fin and p-type contacts for source and drain. In such embodiments, layer 205 is composed of silicon doped with n-type dopants such as phosphorus. In some embodiments, both p-type finFETs and n-type finFETs are utilized in conjunction for a device to operate correctly, and in these embodiments both n-type finFETs and p-type finFETs may be present on the same substrate. Other materials of which layer 205 may be formed include, but are not limited to germanium, III-V semiconductor materials, II-IV semiconductor materials, carbon, silicon carbide, or silicon-germanium alloy materials. In a preferred embodiment, layer 205 is between 5 nm and 50 nm thick and is preferably about 20 nm thick. In various embodiments, the outermost surface of layer 205 is covered with a thin oxide layer between 1 and 2 nm thick to prevent direct conductivity between layer 205 and the gate terminal of the finFET device. In some embodiments, the outer surface of layer 205 is oxidized using a process such as thermal oxidation. A person of ordinary skill in the art will recognize that chemical-mechanical planarization (CMP) steps may be inserted before and after the deposition of layer 205 to ensure that the top surfaces of both buried oxide layer 120 and layer 205 are relatively flat. The process of patterning the deposited layer of material of which layer 205 is created to define the desired shape of layer 205 involves the use of standard photolithographic processes to define the desired shape of layer 205 in a layer of photoresist (not shown) deposited on the layer of material of which layer 205 is formed. In various embodiments, standard photolithographic processes are used to remove a portion of the photoresist layer corresponding to the area of the layer of material of which layer 205 is to be formed which is to be etched during the formation of layer 205. The pattern of layer 205 defined in the photoresist layer is formed into the layer of material of which layer 205 is formed by removing portions of material from the areas not protected by the pattern in the photoresist layer. The portions of the material of which layer 205 is formed are removed using, for example, reactive ion etching (RIE). RIE uses chemically reactive plasma, generated by an electromagnetic field, to remove various materials. A person of ordinary skill in the art will recognize that the type of plasma used will depend on the material of which layer 205 is composed, or that other etch processes, e.g., wet chemical etch, laser ablation, etc., may be used.

Figure 3A:
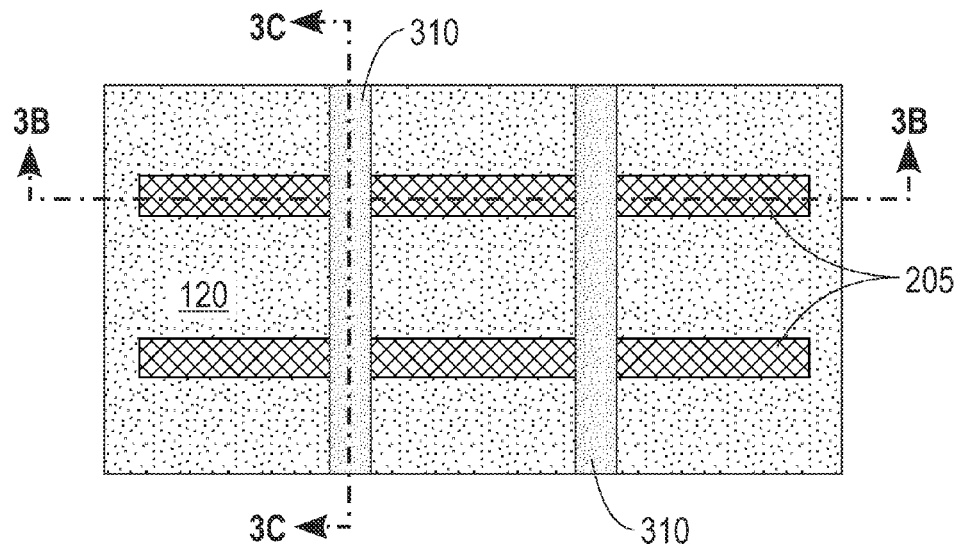
FIG. 3A depicts a top view of the deposition and etching of a dummy gate material on the semiconductor substrate of FIG. 1A in accordance with an embodiment of the invention.
Figure 3B:
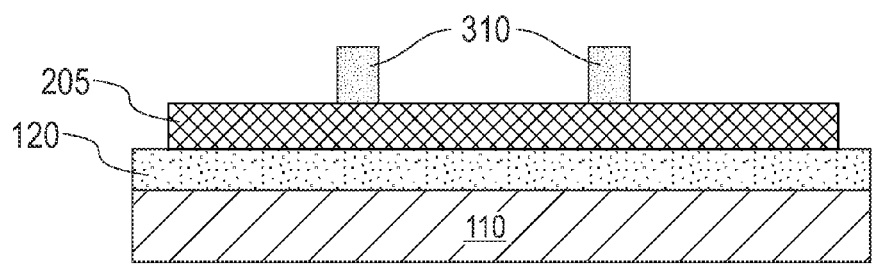
FIG. 3B depicts a section view of the deposition and etching of a dummy gate material on the semiconductor substrate of FIG. 1A in accordance with an embodiment of the invention.
Figure 3C:
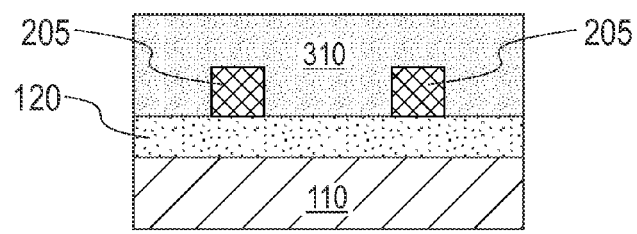
FIG. 3C depicts a section view of the deposition and etching of a dummy gate material on the semiconductor substrate of FIG. 1A in accordance with an embodiment of the invention.

FIGS. 3A, 3B, and 3C illustrate a top and two section views of the deposition and patterning of dummy gate 310, in accordance with an embodiment of the invention. It should be appreciated that any number of dummy gates can be present in various embodiments of the invention, and that dummy gate 310 refers to each dummy gate depicted in FIGS. 3A, 3B, and 3C individually. Dummy gate 310 is used to form the gate terminal of the finFET device formed in the following steps. In a preferred embodiment, dummy gate 310 is composed of silicon nitride, deposited using, for example, low pressure chemical vapor deposition (LPCVD). Other materials of which dummy gate 310 may be formed include, but are not limited to, silicon oxide, silicon oxide doped with carbon, titanium oxide, hafnium oxide, any other insulative material. In a preferred embodiment, dummy gate 310 is between 20 nm and 200 nm thick and is preferably about 70 nm thick. A person of ordinary skill in the art will recognize that CMP steps may be inserted before and after the deposition of dummy gate 310 to ensure that the top surface of dummy gate 310 is relatively flat. The process of patterning dummy gate 310 to define the desired shape of dummy gate 310 to be created involves the use of standard photolithographic processes to define the desired shape of the fins in a layer of photoresist (not shown) deposited on the material of which dummy gate 310 is formed. In various embodiments, standard photolithographic processes are used to remove a portion of the photoresist layer corresponding to the area of the material of which dummy gate 310 is formed which is to be etched during the formation of dummy gate 310. The pattern of dummy gate 310 defined in the photoresist layer is formed into dummy gate 310 by removing dummy gate 310 from the areas not protected by the pattern in the photoresist layer. The portion of the material of which dummy gate 310 is formed is removed using, for example, RIE. A person of ordinary skill in the art will recognize that the type of plasma used in the RIE process will depend on the material of which dummy gate 310 is composed, or that other etch processes, e.g., wet chemical etch, laser ablation, etc., may be used.

Figure 4A:
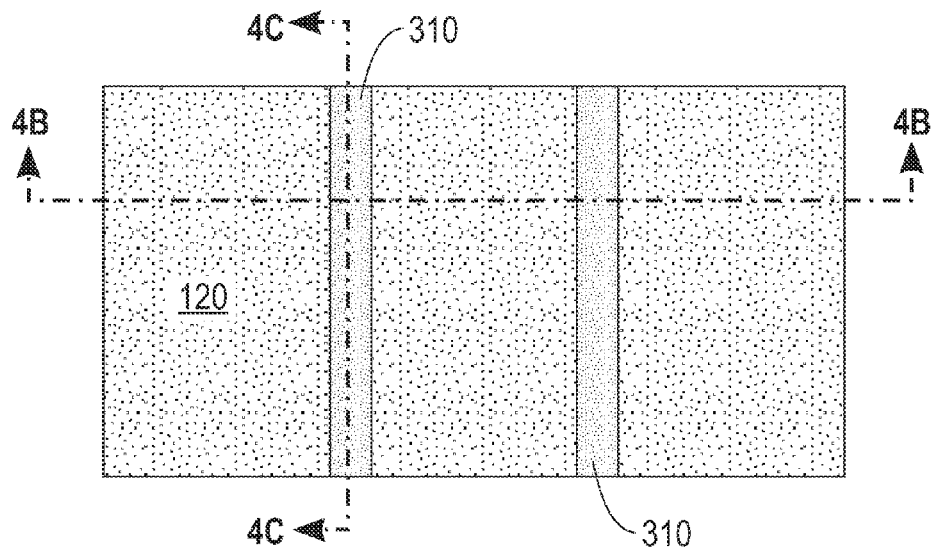
FIG. 4A depicts a top view of the etching of the layer of semiconductor material of FIG. 2A to form a fin, in accordance with an embodiment of the invention.
Figure 4B:
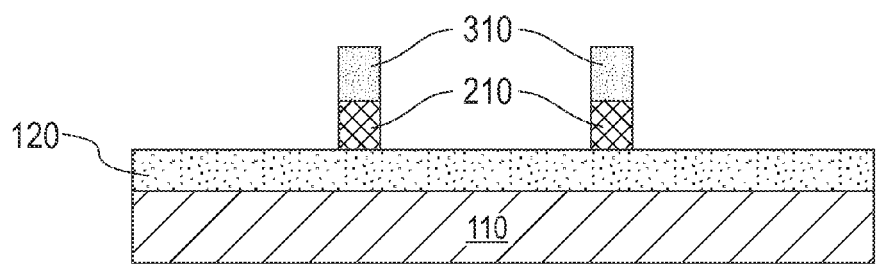
FIG. 4B depicts a section view of the etching of the layer of semiconductor material of FIG. 2A to form a fin, in accordance with an embodiment of the invention.
Figure 4C:
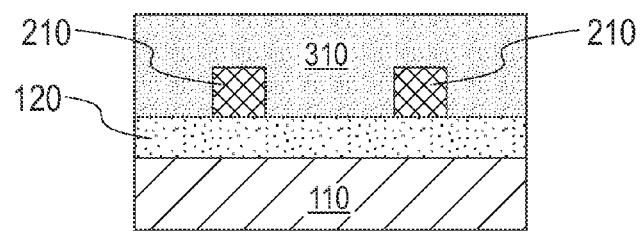
FIG. 4C depicts a section view of the etching of the layer of semiconductor material of FIG. 2A to form a fin, in accordance with an embodiment of the invention.

FIGS. 4A, 4B, and 4C depict a top view and two section views of the etching of portions of layer 205 which are not covered by dummy gate 310 to form fin 210, in accordance with an embodiment of the invention. Portions of layer 205 are removed using, for example, RIE to form fin 210 which acts as the channel of the current finFET device. Similarly to the etching steps used to form layer 205 and dummy gate 310 in the depicted embodiment, the process of etching the portions of layer 205 not under dummy gate 310 to form the desired shape of fin 210 involves the use of standard photolithographic processes to define the desired shape of fin 210 in a layer of photoresist (not shown) deposited on layer 205. In various embodiments, standard photolithographic processes are used to remove a portion of the photoresist layer corresponding to the area of layer 205 which is to be etched during the formation of the fin 210. The pattern of fin 210 defined in the photoresist layer is formed into layer 205 by removing portions of layer 205 from the areas not protected by the pattern in the photoresist layer. In some embodiments, the portions of dummy gate 310 present above layer 205 act as a hard mask for the etching process instead of the layer of photoresist deposited in the depicted embodiment. The portion of layer 205 is removed using, for example, RIE. A person of ordinary skill in the art will recognize that the type of plasma used in the RIE process will depend on the material of which layer 205 is composed, or that other etch processes, e.g., wet chemical etch, laser ablation, etc., may be used. While the portion of layer 205 located under dummy gate 310 is required for the device to operate correctly, it is desirable to replace the portions of layer 205 not located under dummy gate 310 so that they can be replaced with a lower resistance material such as a metal. Replacing the portions of layer 205 not located under dummy gate 310 with a lower resistance material decreases the overall resistance of the finFET device and as a result reduces the parasitic resistance of the finFET device.

Figure 5A:
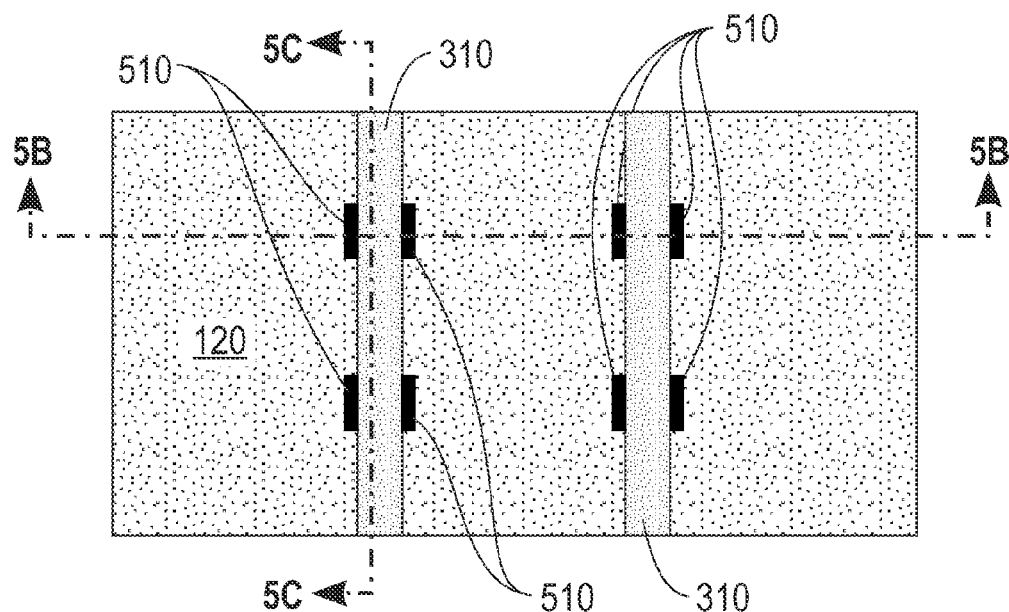
FIG. 5A depicts a top view of the epitaxial growth of a doped source-drain region on the exposed portion of the fin of FIG. 4A, in accordance with an embodiment of the invention.
Figure 5B:
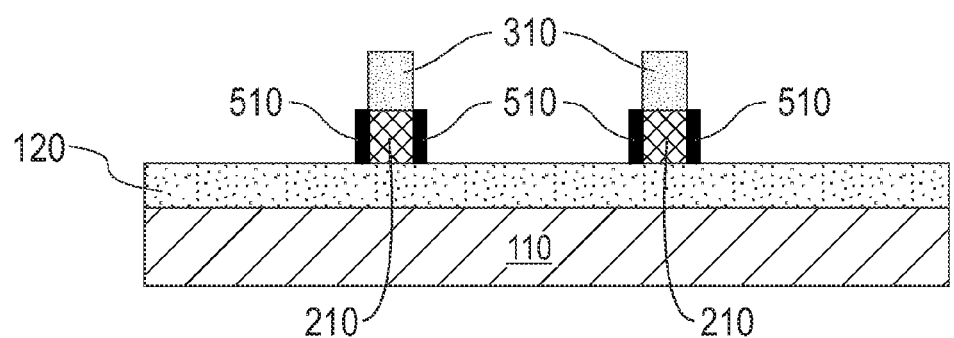
FIG. 5B depicts a section view of the epitaxial growth of a doped source-drain region on the exposed portion of the fin of FIG. 4A, in accordance with an embodiment of the invention.
Figure 5C:
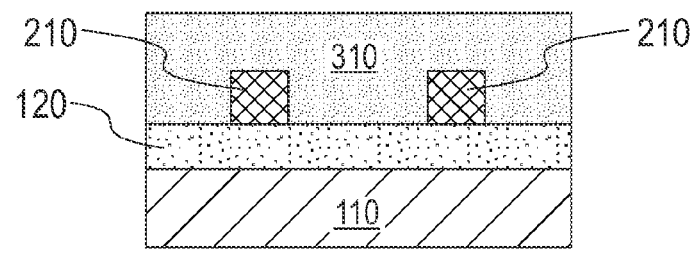
FIG. 5C depicts a section view of the epitaxial growth of a doped source-drain region on the exposed portion of the fin of FIG. 4A, in accordance with an embodiment of the invention.

FIGS. 5A, 5B, and 5C depict a top view and two section views of the selective epitaxial growth of source and drain region 510, in accordance with an embodiment of the invention. In embodiments such as the depicted embodiment where the current device is an n-type finFET, source and drain region 510 is composed of silicon doped with n-type dopants such as phosphorus. In embodiments where the current device is a p-type finFET, source and drain region 510 is composed of silicon doped with a p-type dopant such as boron. In general, source and drain region 510 is composed of a material with an opposite conductivity type of the material of which fin 210 is composed. Forming source and drain region 510 on the exposed portions of fin 210 involves forming source and drain region 510 using a process such as selective chemical vapor deposition (CVD), molecular beam epitaxy (MBE), atomic layer deposition (ALD), or any other technique known in the art for epitaxially growing a layer of a semiconductor material. In general, source and drain region 510 is present on both exposed sides of each portion of fin 210. For each pair of source and drain region 510, one source and drain region 510 will act as the source terminal while the other source and drain region 510 located on the other side of fin 210 will act as the drain terminal for the given finFET device.

Figure 6A:
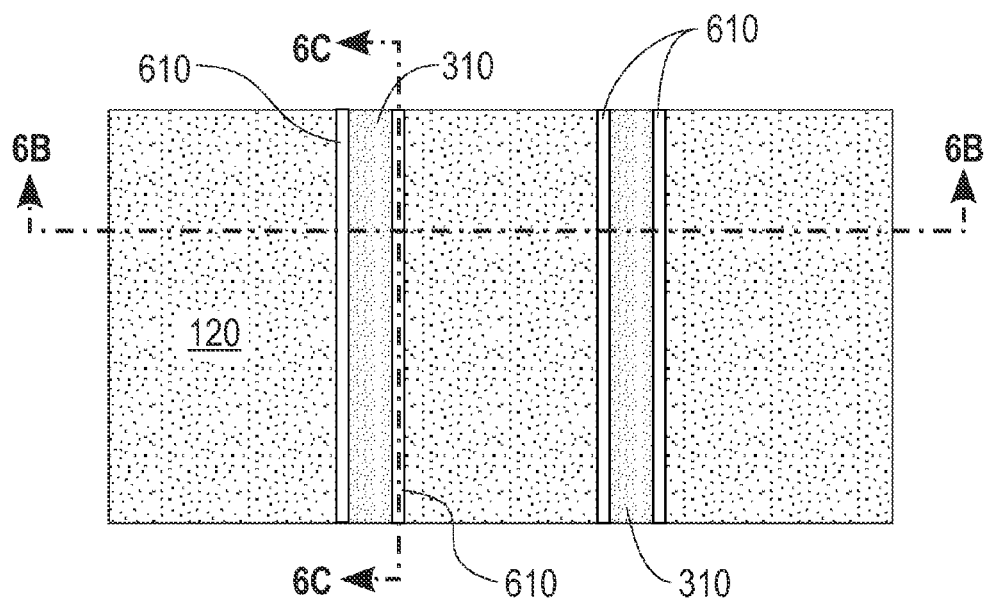
FIG. 6A depicts a top view of the deposition and etching of a dielectric spacer material formed on the exposed portions of the side of the dummy gate material of FIG. 3A, in accordance with an embodiment of the invention.
Figure 6B:
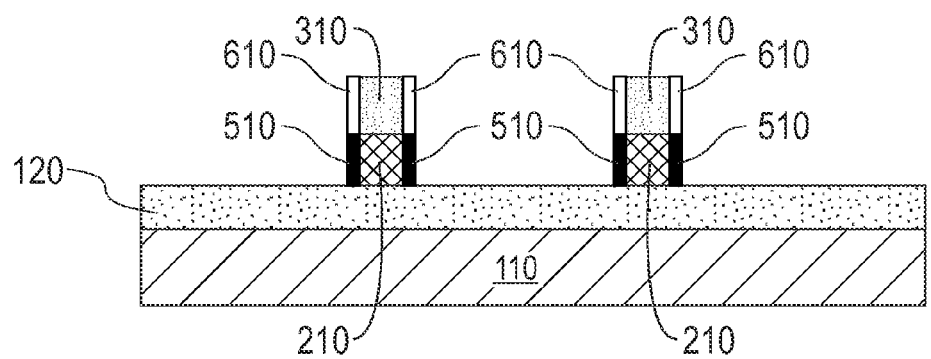
FIG. 6B depicts a section view of the deposition and etching of a dielectric spacer material formed on the exposed portions of the side of the dummy gate material of FIG. 3A, in accordance with an embodiment of the invention.
Figure 6C:
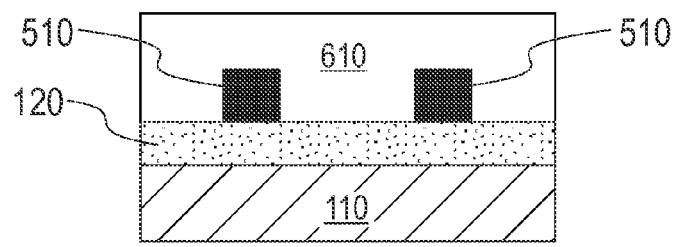
FIG. 6C depicts a section view of the deposition and etching of a dielectric spacer material formed on the exposed portions of the side of the dummy gate material of FIG. 3A, in accordance with an embodiment of the invention.

FIGS. 6A, 6B, and 6C illustrate a top view and two section views of the formation of dielectric spacer 610, in accordance with an embodiment of the invention. For example, forming dielectric spacer 610 may include depositing a conformal layer (not shown) of insulating material, such as silicon nitride, over buried oxide layer 120, dummy gate 310, and source and drain region 510, such that the thickness of the deposited layer on the sidewall of dummy gate 310 and source and drain region 510 is substantially the same as the thickness of the deposited layer on the surface of buried oxide layer 120. An anisotropic etch process, where the etch rate in the downward direction is greater than the etch rate in the lateral directions, may be used to remove portions of the insulating layer, thereby forming dielectric spacer 610. The etch process can be controlled such that the insulating layer may be removed from the sidewall of source and drain region 510 while forming dielectric spacer 610.

Figure 7A:
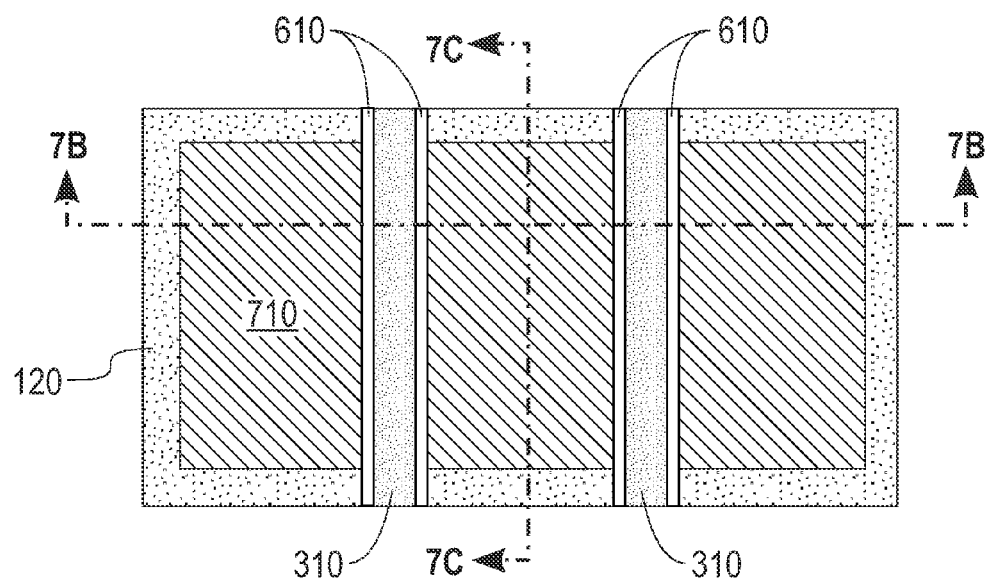
FIG. 7A depicts a top view of the deposition and etching of a metal fin formed on the semiconductor substrate of FIG. 1A, in accordance with an embodiment of the invention.
Figure 7B:
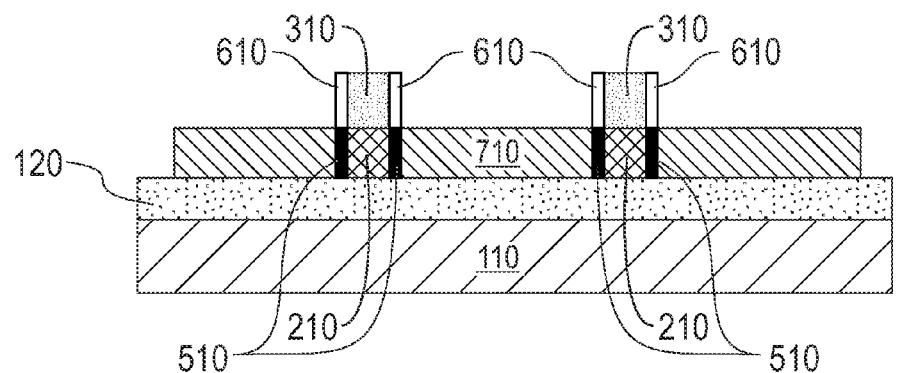
FIG. 7B depicts a section view of the deposition and etching of a metal fin formed on the semiconductor substrate of FIG. 1A, in accordance with an embodiment of the invention.
Figure 7C:
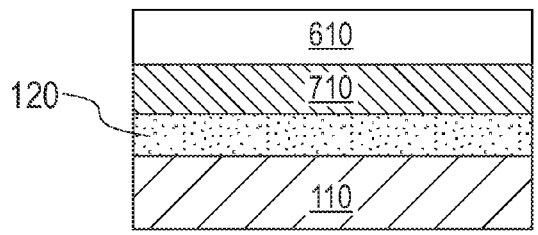
FIG. 7C depicts a section view of the deposition and etching of a metal fin formed on the semiconductor substrate of FIG. 1A, in accordance with an embodiment of the invention.

FIGS. 7A, 7B, and 7C illustrate a top view and two section views of the deposition and patterning of metal fin 710, in accordance with an embodiment of the invention. In some embodiments such as the depicted embodiment, metal fin 710 is used to connect source and drain region 510 to additional metal contacts formed in later steps (see FIGS. 9A, 9B, and 9C), while in other embodiments metal fin 710 is used to connect source and drain region 510 directly to outside electrical components. In a preferred embodiment, metal fin 710 is composed of tungsten, deposited using, for example, chemical vapor deposition (CVD). Other materials of which metal fin 710 may be formed include, but are not limited to, tungsten lined with titanium, titanium, aluminum, or any other metal or combination of metals. In a preferred embodiment, metal fin 710 is between 5 nm and 50 nm thick and is preferably about 20 nm thick. In general, metal fin 710 extends from the top surface of buried oxide layer 120 up to the height of the top surface of fin 210. A person of ordinary skill in the art will recognize that chemical-mechanical planarization (CMP) steps may be present after the deposition of the metal of which metal fin 710 is formed to remove any portion of metal present on the top surface of dummy gate 310 as a result of the deposition process. The process of patterning the deposited metal to form the desired shape of metal fin 710 involves the use of standard photolithographic processes to define the desired shape of metal fin 710 in a layer of photoresist (not shown) deposited on the layer of metal. In various embodiments, standard photolithographic processes are used to remove a portion of the photoresist layer corresponding to the area of the deposited metal which is to be etched during the formation of metal fin 710. The pattern of metal fin 710 defined in the photoresist layer is formed into the deposited metal by removing portions of the deposited metal from the areas not protected by the pattern in the photoresist layer. The portion of deposited metal is removed using, for example, RIE. A person of ordinary skill in the art will recognize that the type of plasma used in the RIE process will depend on the material of which metal fin 710 is composed, or that other etch processes, e.g., wet chemical etch, laser ablation, etc., may be used. In general, metal fin 710 is removed from any region which would not include a fin of semiconductor material in traditional designs, such as a region between an n-type FinFET device and a p-type finFET device.

Metal fin 710 is used to reduce the parasitic resistance of the current finFET device by reducing the overall resistance of the current finFET device in its "ON" state. In traditional finFET devices, a fin takes the form of layer 205 as depicted in FIGS. 2A, 2B, and 2C. In these traditional designs, electrons must flow through the entire fin composed of semiconductor material such as doped silicon or germanium when the device is in the "ON" state. By replacing a portion of layer 205 and replacing it with a lower resistance material such as metal fin 710, electrons can flow through the current finFET device in its "ON" state more easily than designs where the entire fin is composed of a semiconductor material such as doped silicon or germanium. In general, various embodiments of the invention disclose removing as much as possible of the semiconductor material of layer 205 and replacing the removed material with metal while still leaving enough semiconductor material present in fin 210 for the device to operate correctly and prevent a significant leakage current while the device is in the "OFF" state.

Figure 8A:
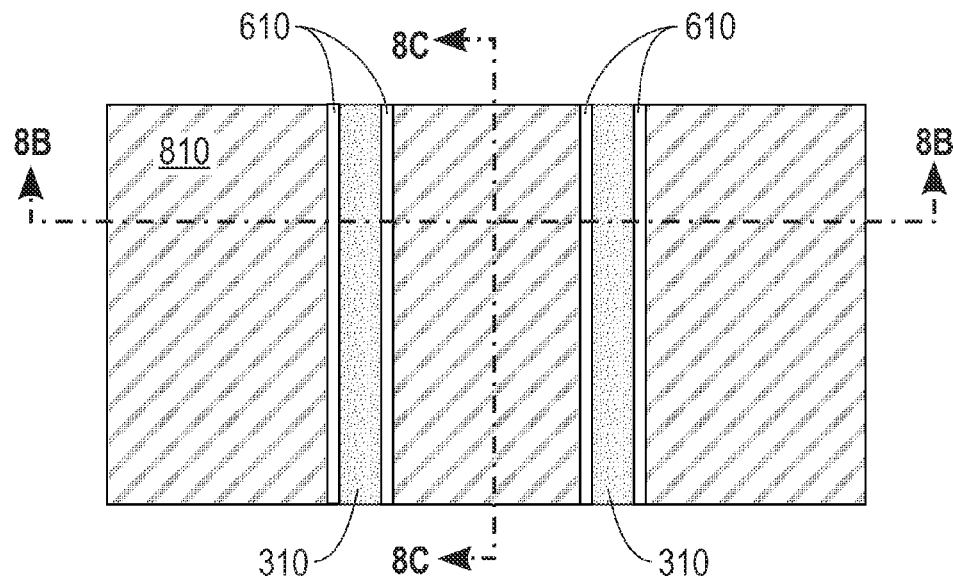
FIG. 8A depicts a top view of the deposition and planarization of an oxide layer formed on the metal fin of FIG. 7A, in accordance with an embodiment of the invention.
Figure 8B:
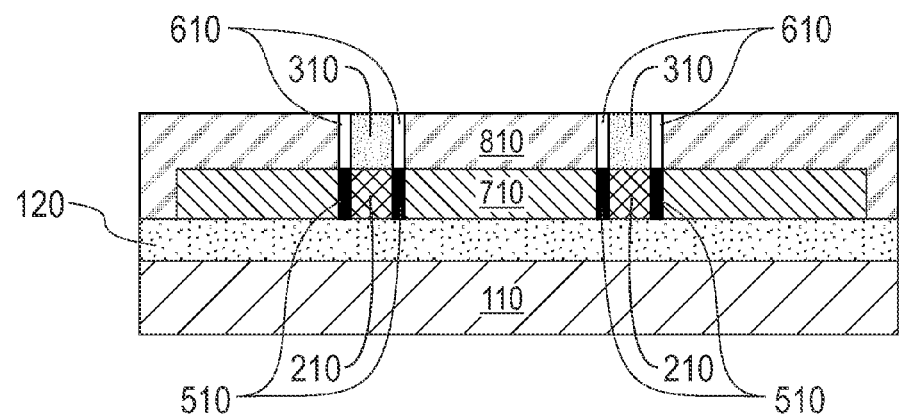
FIG. 8B depicts a section view of the deposition and planarization of an oxide layer formed on the metal fin of FIG. 7A, in accordance with an embodiment of the invention.
Figure 8C:
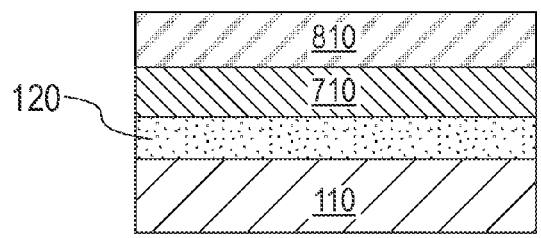
FIG. 8C depicts a section view of the deposition and planarization of an oxide layer formed on the metal fin of FIG. 7A, in accordance with an embodiment of the invention.

FIGS. 8A, 8B, and 8C illustrate a top view and two section views of the deposition and planarization of oxide layer 810, in accordance with an embodiment of the invention. Oxide layer 810 is used to electrically insulate the current finFET device from outside electrical components. In a preferred embodiment, oxide layer 810 is composed of silicon dioxide, deposited using, for example, low pressure chemical vapor deposition (LPCVD). Other materials of which oxide layer 810 may be formed include, but are not limited to, doped carbon, silicon oxynitride, or any other insulative material. In general, oxide layer 810 extends vertically from the top of buried oxide layer 120 to the top of dummy gate 310. A person of ordinary skill in the art will recognize that chemical-mechanical planarization (CMP) steps may be required after the deposition of the material of which oxide layer 810 is formed to planarize the top of oxide layer 810 such that the top of oxide layer 810 is even with the top of dummy gate 310 and no portions of oxide layer 810 are present above the top of dummy gate 310. Additionally, it should be appreciated that FIGS. 8A, 8B, and 8C depict the state of oxide layer 810 after both deposition and planarization operations have been performed.

Figure 9A:
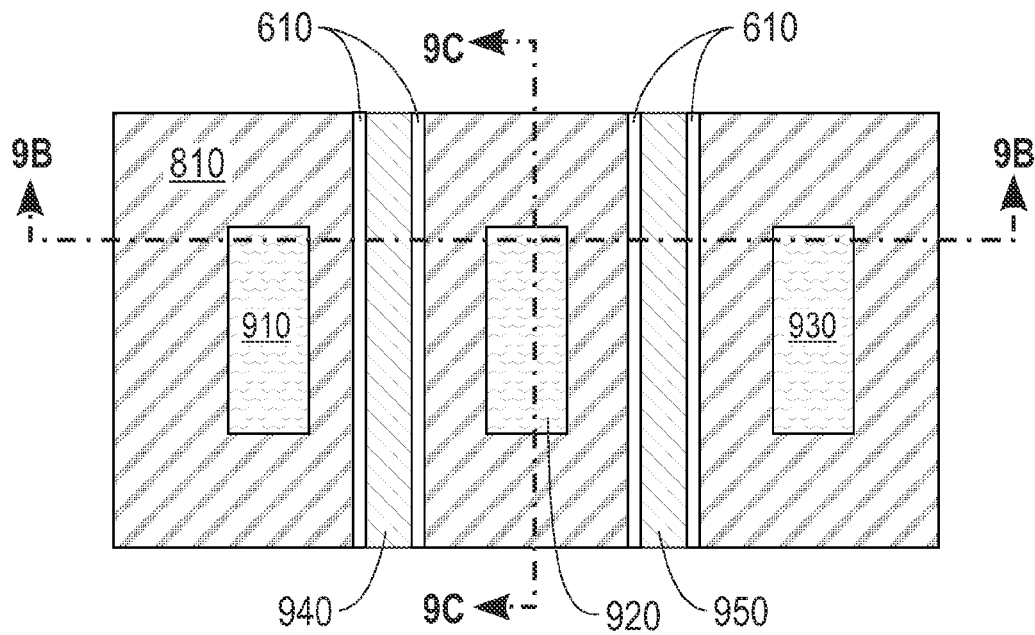
FIG. 9A depicts a top view of the formation of metal contacts and the replacement of the dummy gate of FIG. 3A with a metal gate, in accordance with an embodiment of the invention.
Figure 9B:
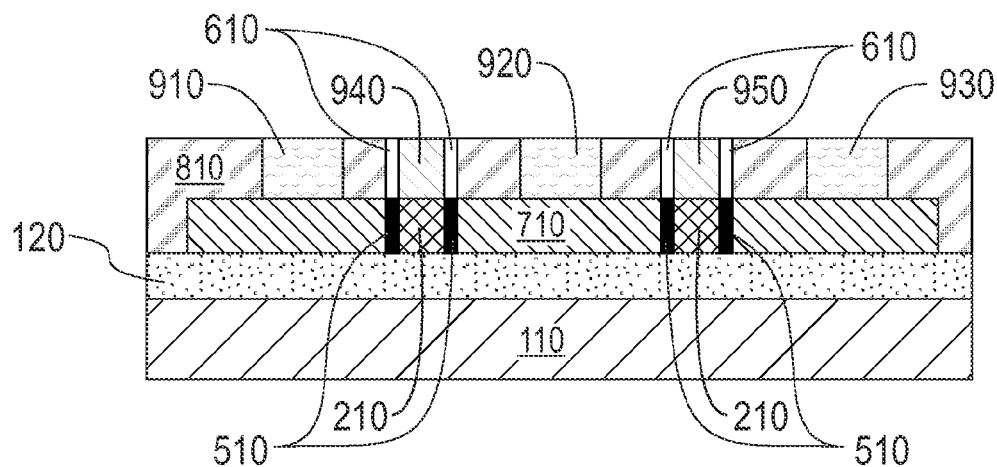
FIG. 9B depicts a section view of the formation of metal contacts and the replacement of the dummy gate of FIG. 3A with a metal gate, in accordance with an embodiment of the invention.
Figure 9C:
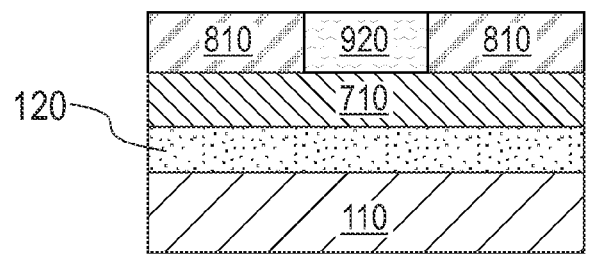
FIG. 9C depicts a section view of the formation of metal contacts and the replacement of the dummy gate of FIG. 3A with a metal gate, in accordance with an embodiment of the invention.

FIGS. 9A, 9B, and 9C illustrate a top and two section views of the formation of contacts 910, 920, and 930 and the replacement of dummy gate 310 with metal gates 940 and 950 in accordance with an embodiment of the invention. Contacts 910, 920, and 930 are used to electrically connect the current finFET device to outside electrical components including but not limited to other finFET devices, additional electrical components such as capacitors and resistors, or any other electrical components. In a preferred embodiment, contacts 910, 920, and 930 are composed of copper and deposited using plating techniques well known in the art. Other materials of which contacts 910, 920, and 930 may be formed include, but are not limited to, tungsten, titanium, or any other metal or combination of metals. In general, contacts 910, 920, and 930 extend vertically from the top of metal fin 710 to the top of oxide layer 810. A person of ordinary skill in the art will recognize that chemical-mechanical planarization (CMP) steps may be required after the deposition of the material of which contacts 910, 920, and 930 are formed to planarize the top of contacts 910, 920, and 930 such that the top of contacts 910, 920, and 930 are even with the top of oxide layer 810 and no portions of contacts 910, 920, and 930 are present above the top of oxide layer 810. Additionally, it should be appreciated that FIGS. 9A, 9B, and 9C depict the state of contacts 910, 920, and 930 after both deposition and planarization operations have been performed.

In general, a contact is present on both sides of every gate terminal present in a given embodiment of the invention. In the depicted embodiment, the presence of two gate terminals indicates that the current finFET device includes two functional finFETs on a single wafer. In the depicted embodiment, contact 910 acts as a source terminal for the finFET device controlled by metal gate 940, generally designated the first finFET in accordance with the depicted embodiment of the invention. Contact 920 acts as a common drain terminal for both the first finFET and the finFET device controlled by metal gate 950, generally designated the second finFET device, in accordance with the depicted embodiment of the invention. Contact 930 acts as the source terminal for the second finFET device. In embodiments where more than two gate terminals are present, additional common source and drain terminals may be present. For example, in an embodiment with three gate terminals and subsequently three finFET devices, four contacts in total are required. The first contact acts as the source for the first finFET device, the second contact acts as a common drain for the first and second finFET devices, the third contact acts as a common source for the second and third finFET devices, and the fourth contact acts as the drain for the third finFET device.

Metal gates 940 and 950 are used to control the operation of the current finFET device by altering the electric field applied to fin 210. The process of forming metal gates 950 and 960 include selectively etching dummy gate 310 using, for example, RIE, depositing a gate dielectric layer, depositing the material of which metal gate 940 and 950 are to be formed, and planarizing the top of metal gates 940 and 950 to be even with the top of oxide layer 810. It should be appreciated that in some embodiments, metal gate 940 and 950 will include a gate dielectric layer (not shown) to prevent direct conduction between metal gate 940 and 950 and fin 210. In a preferred embodiment, this gate dielectric is composed of hafnium oxide (HfO), tantalum oxide (TaO), titanium oxide (TiO), lanthanum oxide (LaO), or any other insulative material. In a preferred embodiment, metal gates 940 and 950 are composed of titanium nitride (TiN), tantalum nitride (TaN), aluminum (Al), or tungsten (W), or any other metal deposited using, for example, low pressure chemical vapor deposition (LPCVD). Other materials of which metal gates 940 and 950 may be formed include, but are not limited to, tungsten, titanium, or any other metal. In general, metal gates 940 and 950 are formed such that metal gates 940 and 950 take the same geometric form of dummy gate 310 as depicted in FIGS. 8A, 8B, and 8C. A person of ordinary skill in the art will recognize that CMP steps may be required after the deposition of the material of which metal gates 940 and 950 are formed to remove portions of material of which metal gates 940 and 950 are formed present above the top of oxide layer 810.

The current finFET design reduces the parasitic capacitance by limiting the height of metal fin 710 in comparison to the fin of other finFET designs known in the art. In other finFET designs known in the art, the source and drain terminals are created by epitaxially forming a region of doped semiconductor material on the exposed portions of fin 210. In these designs, due to the use of an epitaxial growth process to form the source and drain terminals of the device, the height of the source and drain terminals increases as the source and drain terminals are grown outward from fin 210. As a result of this increase in height, at least a portion of the source and drain terminals is present at a higher topography than fin 210 and is present directly adjacent to dielectric spacer 610. The close proximity of a portion of a source or drain terminal to the gate terminal of the device leads to increased parasitic capacitance and interferes with the operation of the device.

The invention discloses forming a metal extension of source and drain region 510 to serve as the rest of the fin. In general, the process of forming a metal layer allows for much greater control of the height of the layer compared to epitaxially growing a layer of semiconductor material. This greater control ensures that no portion of metal fin 710 will be present at a topology higher than source and drain region 510 and in particular that no portion of metal fin 710 will be present at the height of metal gate 950 or dielectric spacer 610. This increase in the distance between the gate of the device and the source or drain of the device leads to a reduction in the electric field present between the gate terminal and source or drain terminal of the device which reduces the overall parasitic capacitance of the device.

The method as described above is used in the fabrication of integrated circuit chips.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Having described embodiments of a method for reducing parasitic resistance and parasitic capacitance in finFET devices (which are intended to be illustrative and not limiting), it is noted that modifications and variations may be made by persons skilled in the art in light of the above teachings. It is therefore to be understood that changes may be made in the particular embodiments disclosed which are within the scope of the invention as outlined by the appended claims.

What is claimed is:

1. A semiconductor device comprising:
   a substrate;
   a fin formed on the substrate;
   a gate layer formed on the fin and the substrate;
   one or more doped source and drain regions epitaxially formed on exposed sides of the fin;
   one or more insulative spacers formed on the exposed sides of the gate layer; and
   one or more metal fins formed laterally adjacent to the one or more doped source and drain regions, wherein the one or more metal fins extend vertically to a height less than or equal to the top of the fin.

2. The semiconductor device of claim 1, further comprising:
   an oxide layer formed on the one or more metal fins and the substrate; and
   a metal contact formed in the oxide layer above at least a portion of each metal fin of the one or more metal fins.

3. The semiconductor device of claim 1, wherein the substrate includes a buried oxide layer.

4. The semiconductor device of claim 1, wherein the one or more doped source and drain regions extend vertically to a height less than or equal to the top of the fin.

5. The semiconductor device of claim 1, wherein the fin includes an oxide layer formed on outer surfaces of the fin.

6. The semiconductor device of claim 5, wherein the oxide layer is formed by oxidizing the outer surfaces of the fin.

7. A method of fabricating a semiconductor device, the method comprising:
   providing a substrate;
   forming a fin on the substrate;
   forming a dummy gate on the fin and the substrate;
   etching portions of the fin not located below the dummy gate;
   epitaxially forming doped source and drain regions on exposed sides of the fin;
   forming an insulative spacer on exposed sides of the dummy gate; and forming one or more metal fins laterally adjacent to the doped source and drain regions, wherein the one or more metal fins extend vertically to a height less than or equal to the top of the fin.

8. The method of claim 7, further comprising:
forming an oxide layer on the one or more metal regions and the substrate; and
forming a metal contact in the oxide layer above at least a portion of each metal region of the one or more metal regions.

9. The method of claim 7, wherein the substrate includes a buried oxide layer.

10. The method of claim 7, wherein the doped source and drain regions on the exposed sides of the fin extend vertically to a height less than or equal to the top of the fin.

11. The semiconductor device of claim 7, further comprising:
forming an oxide layer formed on outer surfaces of the fin.

12. The semiconductor device of claim 11, wherein the oxide layer is formed by oxidizing the outer surfaces of the fin.

* * * * *